US012712500B1

(12) United States Patent
Magrath

(10) Patent No.: US 12,712,500 B1
(45) Date of Patent: Aug. 18, 2026

(54) CLASS D AMPLIFIER

(71) Applicant: Renesas Design Netherlands B.V., 's-Hertogenbosch (NL)

(72) Inventor: Anthony Magrath, Edinburgh (GB)

(73) Assignee: Renesas Design Netherlands B.V., 's-Hertogenbosch (NL)

( * ) Notice: Subject to any disclaimer, the term of this patent is extended or adjusted under 35 U.S.C. 154(b) by 343 days.

(21) Appl. No.: 18/397,423

(22) Filed: Dec. 27, 2023

(51) Int. Cl.
*H03F 3/217* (2006.01)

(52) U.S. Cl.
CPC ......... *H03F 3/217* (2013.01); *H03F 2200/03* (2013.01)

(58) Field of Classification Search
CPC ...... H03F 3/217; H03F 3/2171; H03F 3/2173; H03F 3/2175; H03F 3/2176; H03F 3/2178; H03F 2200/156; H03F 2200/159; H03F 2200/249
See application file for complete search history.

(56) References Cited

U.S. PATENT DOCUMENTS

| | | | | |
|---|---|---|---|---|
| 9,628,040 B2 * | 4/2017 | Lesso | | H03F 3/2175 |
| 11,245,368 B2 * | 2/2022 | Togawa | | H03F 3/2171 |
| 11,799,426 B2 * | 10/2023 | Klarenbeek | | H03F 3/2173 |
| 2008/0278230 A1 * | 11/2008 | Kost | | H03F 3/2173 330/10 |
| 2017/0055076 A1 * | 2/2017 | Buono | | H03F 3/183 |
| 2017/0294888 A1 * | 10/2017 | Berkhout | | H03F 3/2175 |
| 2018/0191315 A1 * | 7/2018 | Poulsen | | H03F 3/2173 |

FOREIGN PATENT DOCUMENTS

| | | | |
|---|---|---|---|
| EP | 3714543 B1 * | 4/2024 | H03F 3/217 |

OTHER PUBLICATIONS

Pavan et al., "Understanding Delta-Sigma Data Converters Second Edition", IEEE Press and Wiley-Intercedence, 2013. 583 pages.

* cited by examiner

*Primary Examiner* — David L Ton
(74) *Attorney, Agent, or Firm* — SCULLY, SCOTT, MURPHY & PRESSER, P.C.

(57) ABSTRACT

A class D amplifier for audio and an audio system including the class D amplifier are provided. The class D amplifier is configured to be operable in an open loop mode, be operable in a closed loop mode, and switch between the open loop mode and the closed loop mode. A method of controlling a class D amplifier is also provided.

20 Claims, 10 Drawing Sheets

305
304
Class D Amplifier
303
300

310
306
305
304
313
Digital Modulator
Controller
Class D Amplifier
314
308
312
303
320

CLASS D AMPLIFIER

TECHNICAL FIELD

The present disclosure relates to a class D amplifier and more particularly, to a class D amplifier operable in an open loop mode and a closed loop mode.

BACKGROUND

Class D amplifiers are widely utilized in audio applications for their efficiency and compact design. Unlike traditional analog amplifiers, Class D operates as a switch-mode amplifier, using pulse-width modulation (PWM) to convert digital audio signals into analog waveforms. In this design, transistors rapidly switch between on and off states, minimizing power dissipation and heat generation. This efficiency is particularly advantageous for portable and battery-powered devices, such as smartphones and audio gadgets. The output stage in Class D amplifiers produces a series of pulses that, when filtered, reconstruct the original audio signal. This significantly reduces power consumption and enhances energy efficiency, making Class D amplifiers a popular choice in modern audio systems, from high-fidelity home audio to portable speakers and automotive sound systems.

SUMMARY

It is desirable to provide an improved Class D amplifier.

According to a first aspect of the disclosure, there is provided a class D amplifier for audio, wherein the class D amplifier is configured to: be operable in an open loop mode; be operable in a closed loop mode; and switch between the open loop mode and the closed loop mode.

Optionally, the class D amplifier comprising: a controller configured to control the switching of the class D amplifier between the open loop mode and closed loop mode.

Optionally, the class D amplifier comprising: a digital modulator configured to receive a modulator input signal.

Optionally, the digital modulator is configured to operate as a pulse-density modulator arranged to provide a constant width pulse signal whilst the class D amplifier is operating in the open loop mode; and/or the digital modulator is configured to operate as a pulse-width modulator arranged to provide a varying pulse width signal whilst the class D amplifier is operating in the closed loop mode.

Optionally, the controller is configured to provide a communication signal to the digital modulator, the communication signal comprising information on whether the class D amplifier is operating in the open loop mode or the closed loop mode; and the digital modulator is configured to operate as the pulse-density modulator or the pulse-width modulator depending on the mode of the class D amplifier as indicated by the communication signal.

Optionally, the digital modulator comprises: a noise shaper arranged to receive the modulator input signal and to quantize the modulator input signal from a first word length to a second word length, thereby providing a quantized noise shaper output.

Optionally, the noise shaper comprises: a sigma-delta modulator.

Optionally, the first word length comprises 24 bits.

Optionally the second word length comprises 7 bits.

Optionally, the digital modulator comprises: a pulse modulator arranged to receive the quantized noise shaper output and invert the quantized noise shaper output then subsequentially splitting the signal, thereby providing the digital modulator a first bi-level output signal and a second bi-level output signal.

Optionally, the controller comprises: a detector that monitors a property of the class D amplifier; and wherein the controller determines the control switching of the digital modulator between the open loop mode and closed loop mode based on the property monitored by the detector.

Optionally, the class D amplifier comprising: a h-bridge switching element arranged to receive the first bi-level output signal and the second bi-level output signal and provide an error signal.

Optionally, the class D amplifier of claim comprising: an analog-to-digital converter arranged to receive an error signal from the h-bridge switching element and provide a digital error feedback signal.

Optionally, the analog-to-digital converter comprises: a sigma-delta analog-to-digital converter.

Optionally, the class D amplifier comprising: a selectively enabling loop filter configured to receive the digital error feedback signal from the analog-to-digital converter and provide a loop signal to the digital modulator.

Optionally, the controller is configured to transmit a control signal to the loop filter, thereby selectively enabling the loop filter and controlling the switching of the class D amplifier from the open loop mode to the closed loop mode or the switching of the class D amplifier from the closed loop mode to the open loop mode.

Optionally, the property comprises: a first threshold value of a class D amplifier input signal and/or; a pulse collision of the class D amplifier input signal; a quanta differential determined, at least in part, from the modulator input signal and the quantized noise shaper output.

Optionally, the property comprises: a second threshold value of a class D amplifier input signal and/or; a pulse collision of the class D amplifier input signal; a quanta differential determined, at least in part, from the modulator input signal and the quantized noise shaper output.

Optionally, the controller sends a first control signal to the loop filter in response to the detector detecting a first the property of the modulator input signal, wherein the first control signal switch disables the transmission of the selectively enabling second modulator input, thereby transitioning the digital modulator from an open-loop mode to a closed-loop mode.

Optionally, the response to the detector detecting the property of the modulator input signal occurs over a predetermined period.

Optionally, the controller comprises: a clock to record the timer of operation in the closed loop mode and wherein: the controller sends a second control signal to the digital modulator to switch the digital modulator from a closed-loop mode to an open-loop mode in response to the timer recording a predetermined closing time.

According to a second aspect of the disclosure there is provided an audio system comprising the class D amplifier of the first aspect.

Optionally, the audio system comprising a headphones or a speaker.

According to a third aspect of the disclosure, there is provided a method of controlling a class D amplifier being operable in an open loop mode and a closed loop mode, the method comprising: switching from the closed loop mode to the open loop mode; and/or switching from the open loop mode to the closed loop mode.

It will be appreciated that the method of the third aspect may include using and/or providing features set out in the first and/or second aspect, and can incorporate other features as described herein.

BRIEF DESCRIPTION OF THE DRAWINGS

The disclosure is described in further detail below by way of example and with reference to the accompanying drawings, in which.

DETAILED DESCRIPTION

The following text will refer to open-loop and closed-loop configurations in electronic circuits, and more specifically, in reference to Class D amplifiers. A general definition is provided.

Open-loop: An open loop circuit operates without a feedback from the output to the input. An open loop may not employ correction mechanisms based on the actual output, allowing for lower power consumption but may result in poorer performance due to uncorrected inaccuracies in the output stage.

Closed-loop: In contrast to open loop, this circuit integrates feedback from the output to the input. In the feedback loop, it may correct for inaccuracies in the output stage, enhancing performance. A closed loop may be more power-consuming than an open loop circuit, it can offer improved accuracy and stability.

Figures 1A, 1B:
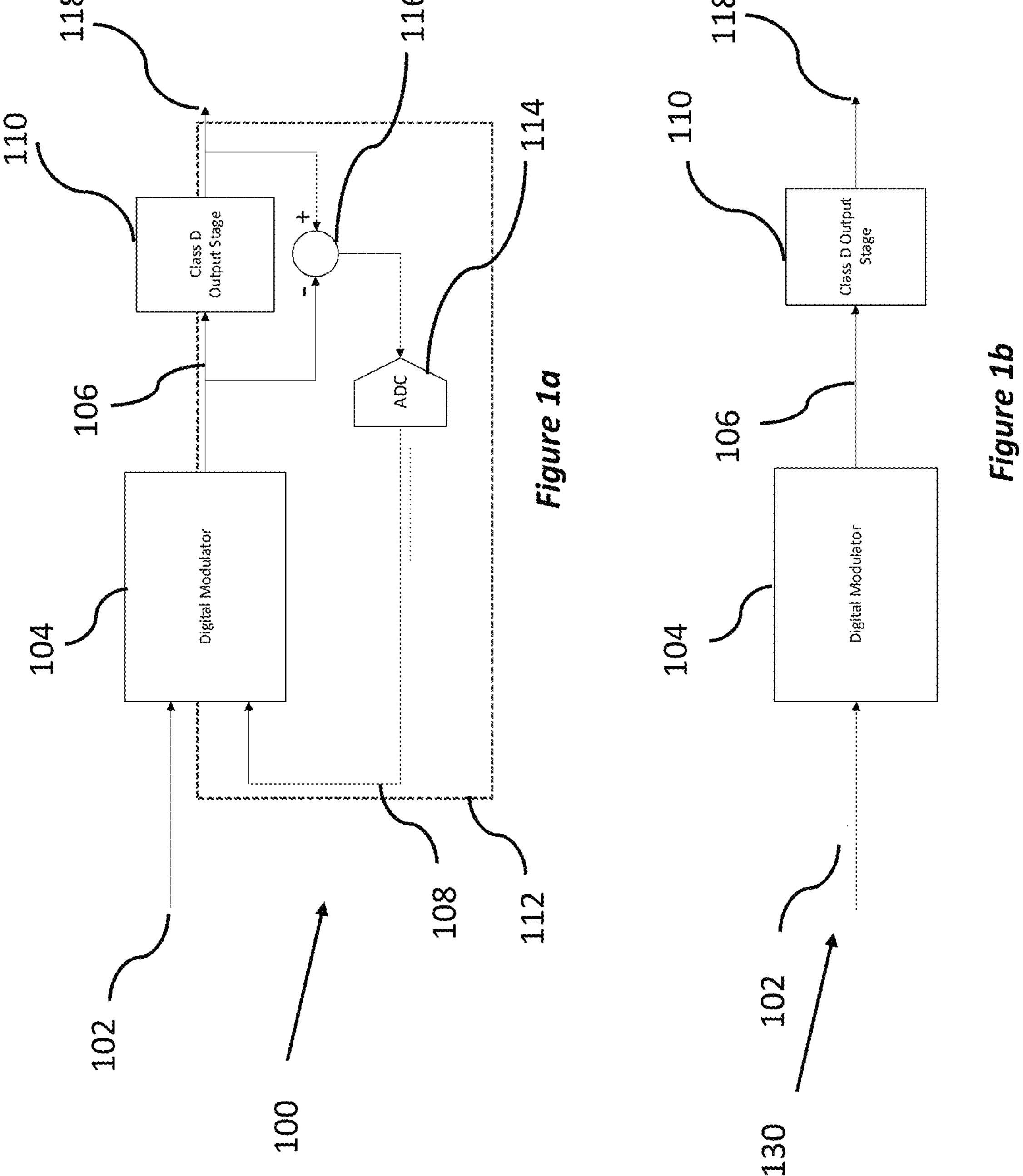
FIG. 1*a* is a schematic of a known class D amplifier with a closed loop configuration.
FIG. 1*b* is a schematic of a known class D amplifier with an open loop configuration.

FIG. 1*a* illustrates a known class D amplifier 100 with a closed loop configuration.

A Class D amplifier 100 is a type of electronic amplifier that operates as a switch-mode amplifier, using pulse-width modulation (PWM) to convert digital signals into analog audio waveforms. Unlike traditional linear amplifiers, Class D amplifiers rapidly switch transistors between fully on and off states. This switching process minimizes power dissipation and heat generation, leading to higher efficiency. The known class D amplifiers 100 may have analogue inputs or digital inputs.

The class D amplifier 100 comprises a digital modulator 104, a class D output stage 110, an operator 116, and an analog-to-digital converter 114.

The digital modulator 104 is a component in signal processing that converts digital signals into a modulated analog format suitable for transmission or further processing. It employs techniques such as Pulse-Width Modulation or Pulse-Density Modulation to represent digital information as analog waveforms. In applications such as audio processing digital modulators play a crucial role in encoding and shaping digital signals for efficient transmission and accurate reconstruction at the receiving end.

The class D amplifier 100 provides a digital modulator output 106 to a Class D output stage 110 and the operator 116.

The Class D output stage refers to the final amplification stage in a Class D audio amplifier 100. In Class D amplifiers, the output stage is responsible for generating a high-power analog audio signal based on the modulated pulse-width modulation (PWM) input from the earlier stages. This output stage 110 may be implemented with a configuration of switching elements. The switching action of the output stage may help minimize power dissipation and heat, contributing to the overall efficiency of Class D amplifiers. The design of the output stage may affect the fidelity of the class D output signal 118.

The operator 116 is a circuit component that may perform the arithmetic operation of subtraction, wherein the operator is an analogue implementation of error derivation. The operator in this example be used to sum two or more analog signals, producing a single output that is the sum of the input signals.

The operator 116 is coupled to the ADC 114 and provides a combined output signal to the ADC 114.

The ADC 114 is an electronic component or system that transforms continuous analog signals into discrete digital representations. It samples the analog input at regular intervals and assigns digital values to these samples, capturing the amplitude of the input signal accurately. This conversion allows analog data, such as audio readings, to be processed, stored, and manipulated by digital systems such as computers.

A typical configuration for the known Class D amplifiers 100 is a closed-loop configuration. In this example there is negative feedback loop 112 configured from the operator 116, coupled to the ADC 114, coupled to the digital modulator 104, coupled across the class D output stage 110, and coupled to adder 116, thereby closing the loop. The closed loop 112 provides a closed-loop error-feedback, where the error across the Class D Output Stage 110 is fed-back.

FIG. 1*b* illustrates a known class D amplifier 130 with an open loop configuration.

Class D amplifier 130 comprises the digital modulator 104 and the class D output stage 110. The class D amplifier 130 receives input signal 102 and transmits output signal 118. The digital modulator 104 transmits the digital modulator output signal 106 to the class d output stage 106.

The class D amplifier 130 is configured in an open loop configuration as observed by the omission of the closed loop 112 when compared to the closed loop configuration of FIG. 1*a*.

The class D amplifiers 100, 130 have limitations in that each has distinctive advantages and drawbacks. Closed-loop Class D amplifiers 100 utilize negative feedback through error correction, facilitated by the ADC 114, which while effective in compensating for output stage inaccuracies, the need for an ADC 114 introduces power consumption challenges.

Conversely, open-loop Class D amplifiers 130 forego negative feedback and the associated ADC, aiming for reduced power consumption. However, this simplicity often leads to compromised performance due to uncorrected inaccuracies in the output stage 110.

Figure 1C:
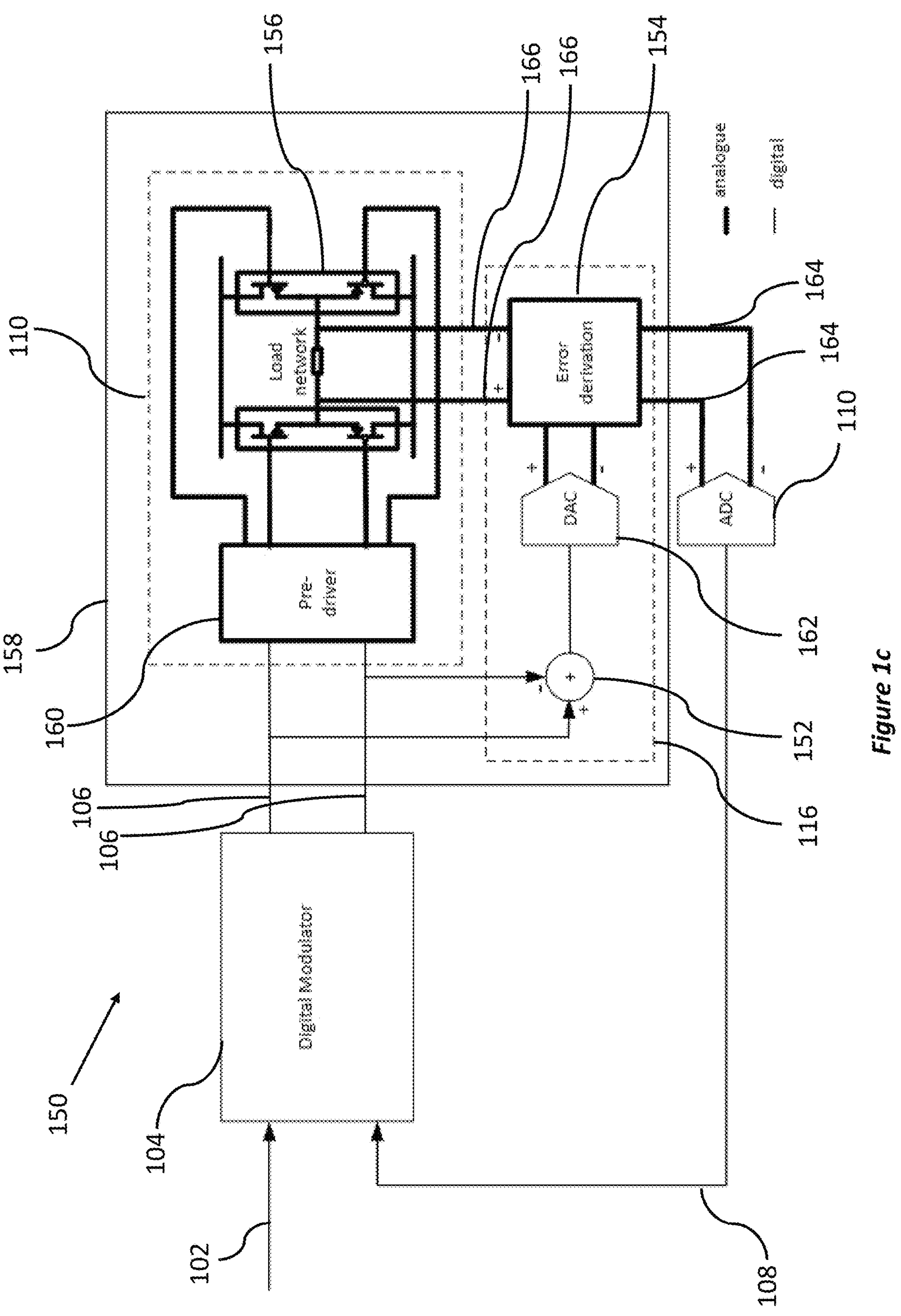
FIG. 1*c* is a schematic of a known class D amplifier with a H-bridge with a closed loop configuration.

FIG. 1*c* illustrates a known class D amplifier 150 comprising a DM output stage 158.

In this example, the H-bridge+Error (HE) stage 150 may comprise the class output stage D 110, which may be referred to as an h-bridge switching element, and an operator 116, which may in this example be referred to as an error deriver stage.

The h-bridge switching element 110 comprises a pre-driver 160 coupled to a load network 156. The pre-driver 160 is a circuit or component that serves to interface between the control circuitry and the power switching devices within the H-bridge 158. The primary function of the pre-driver 160 is to provide the necessary drive signals with the appropriate voltage and current levels to efficiently control the switching of the load network 156. The load network 156 may comprise power transistors or MOSFETs.

The error deriver stage 116 comprises, a digital adder 152 coupled to a digital-to-analog (DAC) 162, and coupled to an error derivation component 154. The DAC 162 is an electronic component or system that transforms discrete digital signals into continuous analog representations, converting discrete-sampled digital samples to equivalent analogue values.

The error derivation component 154 refers to a component or circuitry responsible for generating an H-bridge error signals 164 by comparing the H-bridge 110 output 166 with the combined output 106.

Figures 2A, 2B:
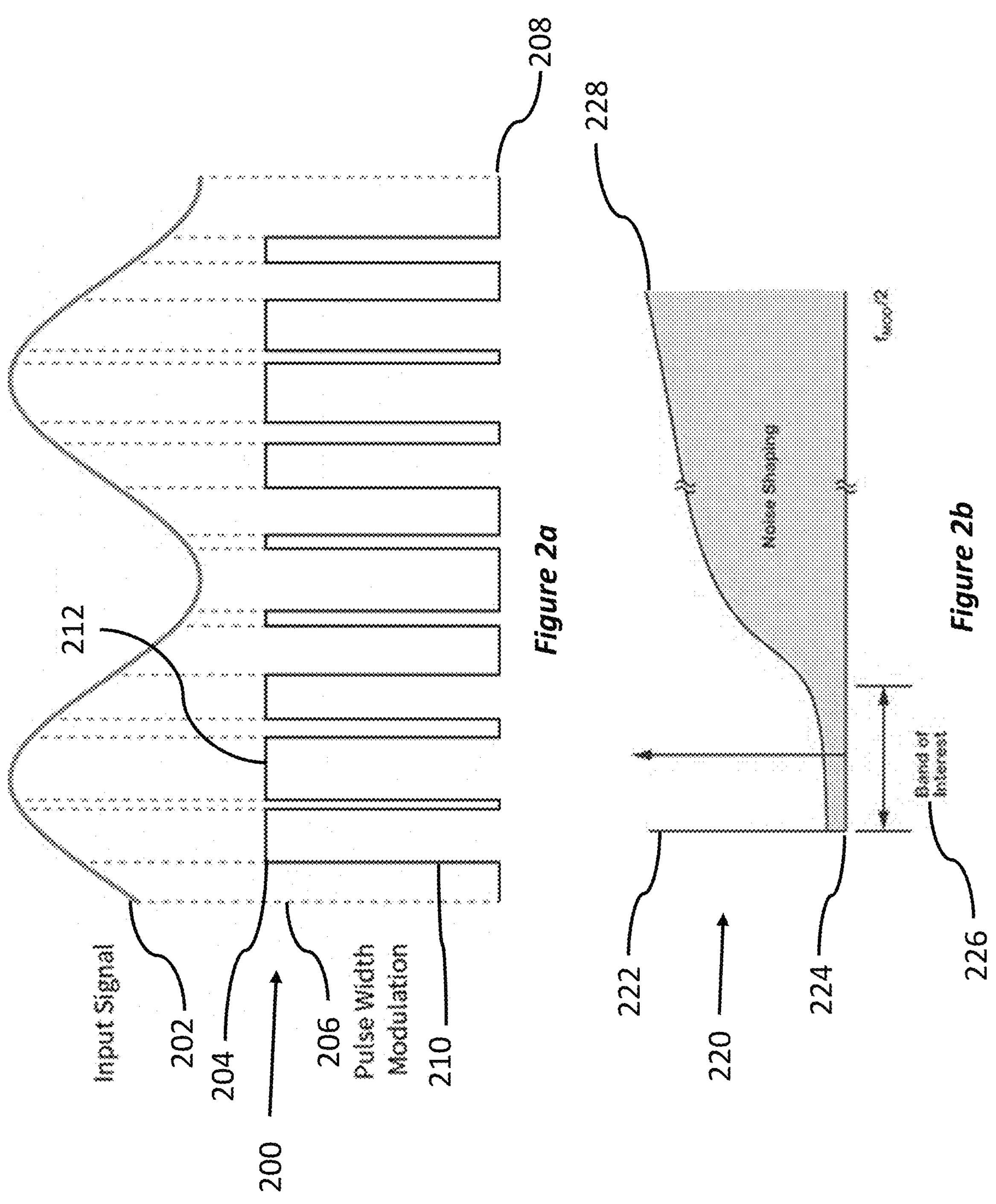
FIG. 2*a* is a graph of a known pulse width modulation.
FIG. 2*b* is a graph of a known noise-shaping signal for a Class D amplifier.

FIG. 2*a* illustrates a known characteristics graph 200 of the digital modulators 106 pulse-width modulation.

A pulse-width modulation input signal 202 (PWMIS) is characterized by amplitude and waveform.

A pulse-width modulation duty cycle signal (PWMDCS) 204 is characterized by timing characteristics, such as the ratio of the pulse widths to the total period of the duty cycle.

The y-axis 206 represents the PWMIS 202 and the duty cycles 204 amplitude, which may be a voltage level. The x-axis 208 depicts a unit of time.

The duty cycle refers to the ratio of pulse widths 212 to the total period. It represents the percentage of time the PWMDCS is in the high state. Ensuring precise control of duty cycle characteristics is critical for the operation of the digital modulator 106.

Pulse width 212 refers to the width of each pulse 210, measured horizontally and indicates the duration of the high (on) state of the duty cycle. A wider pulse 212 corresponds to a longer duration of the high voltage level.

Pulse Repetition Frequency (PRF) refers to the frequency at which the pulses repeat is the pulse repetition frequency. It's the reciprocal of the time between successive rising (or falling) edges of consecutive pulses 210.

Pulse collisions refers to if pulses 210 overlap or collide, it indicates a potential issue in the signal generation process, leading to distortion and inaccuracies. Pulse collisions can affect the linearity of the signal and, in the context of Class D amplifiers, impact the quality of the reproduced audio waveform.

FIG. 2*b* illustrates a known noise-shaping graph 220 of class amplifier D 100, 130.

The noise shaping graph 220 comprises a noise x-axis 222 that represents frequency up to the Nyquist frequency. The noise y-axis 224 represents power spectral density.

The class D amplifiers 100, 130 may utilize noise-shaping techniques of graph 220 to mitigate clock frequency and enhance Signal-to-Noise Ratio (SNR). This may introduce the risk of noise intermodulation and foldback into the audio band, diminishing SNR.

Noise-shaping techniques aim to manage the clock frequency effectively and improve the Signal-to-Noise Ratio (SNR) in a band of interest 226, wherein the band of interest refers to a specific frequency range. The SNR is a measure is a measure of the audio signal quality.

The clock frequency refers to the frequency at which the pulse edges of the modulated output of the digital modulator 106, are generated. The clock frequency is a key parameter in the operation of the Pulse-Width Modulator (PWM) within a Class D amplifier. The clock frequency determines the rate at which the pulse-width modulation occurs, influencing the timing and shape of the output pulses, wherein the rate of at which pulse-width modulation occurs may refer to the rate at which the pulse-edges occur.

The use of these noise-shaping techniques on graph 220 has a potential drawback. There is a risk of noise intermodulation and foldback, where the out-of-band noise introduced during the shaping process can interfere and fold back into the audio frequency range. This interference has the adverse effect of reducing the Signal-to-Noise Ratio, diminishing the overall audio signal quality in the Class D amplifiers 100, 130. The impact of this interference is worse in open loop systems than in closed loop systems.

Figures 3A, 3B:
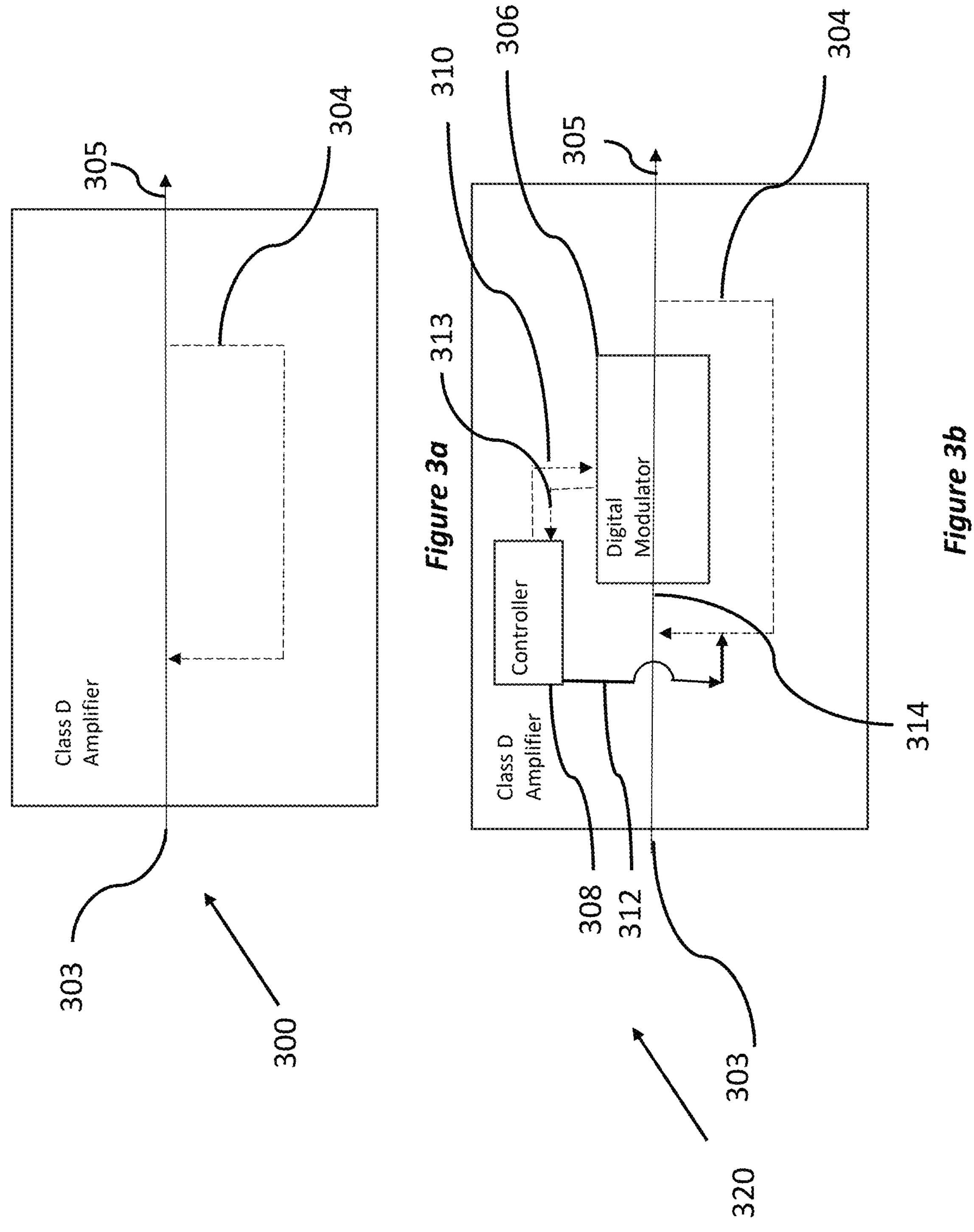
FIG. 3*a* is a schematic of a class D amplifier operable in an open loop mode and closed loop mode in accordance with a first embodiment of the present disclosure.
FIG. 3*b* is a schematic of a class D amplifier having a controller and digital modulator in accordance with a second embodiment of the present disclosure.

FIG. 3*a* is a schematic of a class D amplifier 300 in accordance a first embodiment of the present disclosure.

The class D amplifier 300 is configured to be operable in an open loop mode, to be operable in a closed loop mode and to switch between the open loop mode and the closed loop mode. The class D amplifier 300 may be referred to as hybrid amplifier.

The class D amplifier 300 may receive a class D amplifier input signal 303 and transmit a class D amplifier output signal 305. The class D amplifier 300 may comprise a closed feedback loop 304.

The class D amplifier 300 maybe operable in an open loop mode wherein an open loop mode operates without a closed feedback loop 304 from the class D amplifier input 303 to output 305. An open loop mode may not employ correction mechanisms based on the actual output 305. Open loop mode refers to operations of the class D amplifier 300 not utilizing the closed feedback loop 304.

The class D amplifier 300 may comprise a closed loop feedback loop 304, which may be referred to as closed feedback loop 304, wherein the class D amplifier 300 integrates feedback from the output 305 to the input 303. The close feedback loop 304 may correct for inaccuracies in the output 305, enhancing performance. Closed loop mode refers to operations of the class D amplifier 300 utilizing the closed feedback loop 304.

A closed feedback loop 304 may be more power-consuming than operations in open loop mode but it can offer improved accuracy and stability.

Advantageously, the present disclosure harmonizes the superior signal performance of closed-loop Class D amplifiers 100, with the energy efficiency of open-loop Class D amplifiers 130.

FIG. 3*b* illustrates a class D amplifier 320 having a controller 308 and a digital modulator 306 in accordance a second embodiment of the present disclosure.

The class D amplifier 320 is configured to be operable in an open loop mode and a closed loop mode and wherein the class D amplifier can switch between the open loop mode and the closed loop mode. The class D amplifier 320 comprises the closed feedback loop 304, the digital modulator 104 and the controller 308.

The controller 308 may comprise a detector (not shown) that monitors a property of the class D amplifier wherein the controller 308 determines the control switching of the digital modulator between the open-loop mode and closed-loop mode based on the property monitored by the detector.

The class D amplifier 320 may receive a class D amplifier input signal 303 and transmit a class D amplifier output signal 305.

The digital modulator 306 may share any characteristics of the known digital modulator 104 previously discussed. The digital modulator 306 may be integral to the closed feedback loop 304. The digital modulator 306 may be configured to receive a first modulator input 314 signal. The digital modulator 306 may be operable in an open loop mode and a closed loop mode.

The controller 308 is configured to control the switching of the class D amplifier 320 between the open loop mode and closed-loop mode. For example, the controller 308 may decide when to transition from open-loop mode to closed-loop mode based on the input signal 303 characteristics, or the system parameters of the class D amplifier 320, or based on communication/observation signals 310, 313 between the controller 308 and the digital modulator 306. The controller 308 may transmit a control signal 312.

The control signal 312 may provide switching instructions to switch between the open loop mode and the closed loop mode.

It will be appreciated that in FIG. 3*b*, the control signal 312 being provided to the closed loop 304 is for illustrative purposes and in a specific embodiment, the control signal 312 may be provided to one or more components of the class D amplifier 320.

The controller 308 may receive observation signals 313 wherein the observation signals 313 may be observation data of properties of the digital modulator 306.

The controller 308 may provide the communication signal 310 to the digital modulator 306 where the communication signal 310 comprises information on the mode of operation (open or closed loop) of the class D amplifier 320.

The digital modulator 306 may be configured to operate as a pulse-density modulator whilst the class D amplifier 320 is operating in the open loop mode, and to operate as a pulse-width modulator arranged to provide a varying pulse width signal whilst the class D amplifier 320 is operating in the closed loop mode.

The digital modulator 306 may use the information provided by the communication signal 310 to determine the appropriate modulator to operate as based on the open/closed loop mode status of the class D amplifier 320.

Figures 4A, 4B:
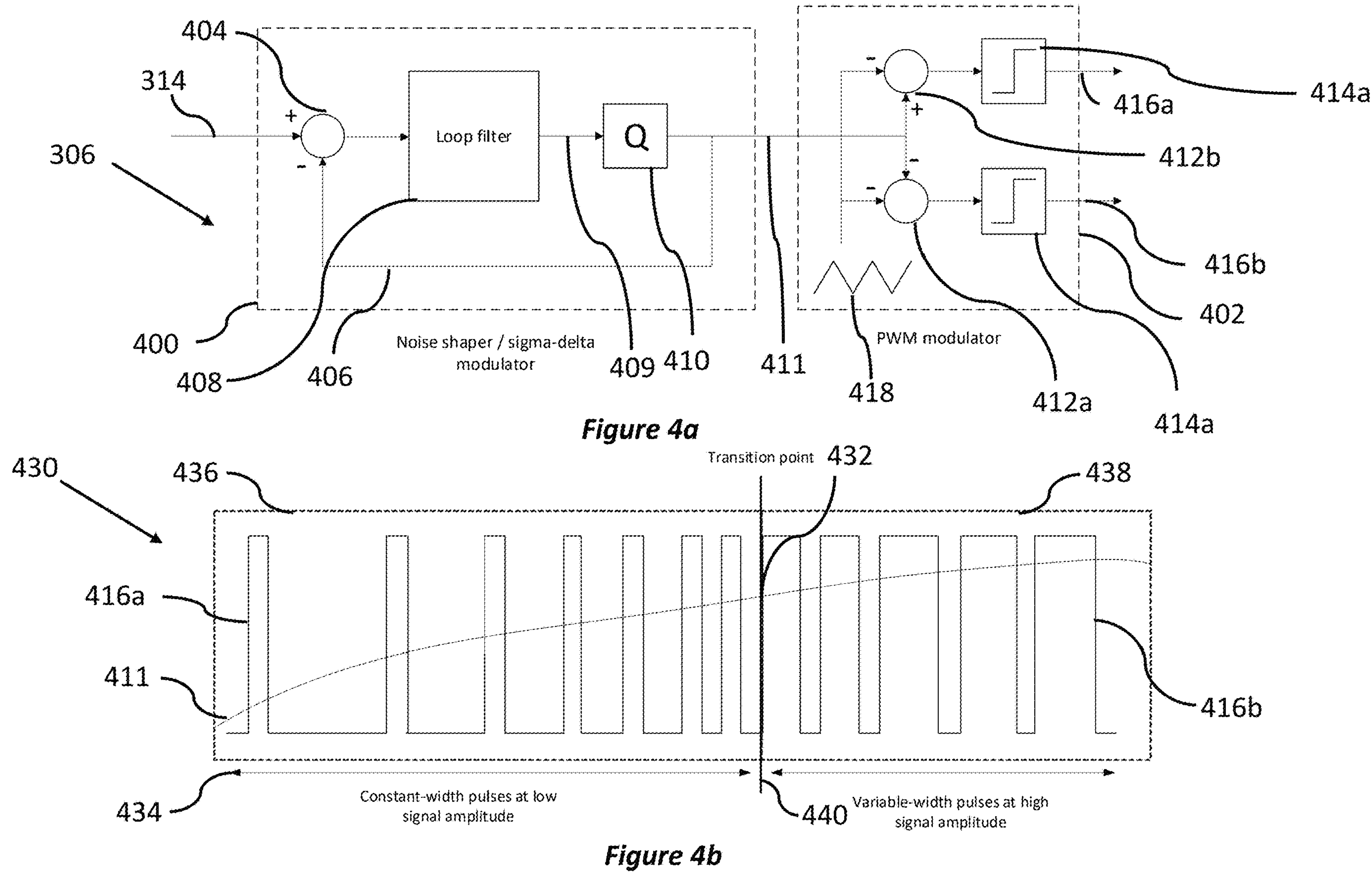
FIG. 4*a* is a schematic of the digital modulator in accordance with a third embodiment of the present disclosure.
FIG. 4*b* is a graph of the characteristics of the digital modulator in accordance with the third embodiment of the present disclosure.

It will be appreciated that when the digital modulator 306 is operating as the pulse density modulator in response to the class D amplifier 320 operating in the open loop mode, the digital modulator 306 may also be referred to as operating in the open loop mode. Similarly, when the digital modulator 306 is operating as a pulse width modulator in response to the class D amplifier operating in the closed loop mode, the digital modulator 306 may be referred to as operating in the closed loop mode The modulator 306 may produce pulse-density modulation, for example at lower amplitude input signal levels before the system switches from closed-loop to open-loop FIG. 4*a* illustrates the digital modulator 306 in accordance a third embodiment of the present disclosure.

In this example, the digital modulator 306 comprises a noise shaper 400 and a pulse modulator. The noise shaper 400 may be referred to as a sigma-delta modulator (SDM). The pulse modulator 402 may be referred to as a pulse width modulator (PWM).

The SDM 400 comprises a sigma-delta adder 404 that receives the modulator input signal 314 and a closed sigma-delta loop signal 406. The adder 404 provides an input to a loop filter 408. The loop filter 408 is a component in control systems and signal processing, designed to shape or filter the output of a feedback loop. The loop filter 408 refines the response by adjusting the characteristics of the feedback signal, enhancing stability, reducing noise, and optimizing performance. Noise shaping is used to prevent loss of precision in the base frequency band.

In SDM 400, the loop filter 408 helps mitigate distortion and regulate the system's behavior by manipulating the feedback signal.

The first block 400 quantizes the input wordlength (which is typically 24 bits) to a lower wordlength (which is typically 7-bits), this enables the digital modulators 306 clock frequency to time the pulse edges to reduce the frequency. To elaborate, this technique is used to decrease the clock frequency associated with timing the edges of the pulses within the output signals 416 generated by the digital modulator 306.

Clock frequency refers to a clock signal that determines the timing of various operations. For digital modulators, the clock is crucial in defining when the edges (transitions) that pulses occur.

Wordlength refers to the number of bits used to represent a digital word or binary number. Wordlength indicates the precision or resolution of a digital representation. A longer wordlength allows for a greater number of discrete values to represent the analog signal, providing higher precision but requiring more storage or transmission bandwidth. For example, a 16-bit ADC can represent analog signals using 2^16 (65,536) discrete levels.

In audio processing, a higher wordlength is often desirable for better dynamic range and signal fidelity. However, the trade-off involves increased data size and processing requirements. The concept of wordlength is crucial in understanding the accuracy and granularity of digital representations in various electronic systems.

The loop filter 408 may provide a loop signal to a quantizer 410 which in turn transmits a quantized output signal 411 for the PWM 402.

The quantizer 410 is a component in digital signal processing that discretizes continuous amplitude input signals into a finite set of discrete output levels. Operating like a digital approximation device, it assigns a specific digital code or value to represent the amplitude of an incoming digital or continuous signal. The incoming signal 409 may have a long wordlength of 24 bits. The quantizer may reduce this wordlength to 7 bits. This process introduces quantization error, which is the difference between the actual analog value and its digital representation. Quantizers 410 are utilized in various audio applications, including analog-to-digital converters and audio processing, where precise representation of continuous signals is necessary for accurate digital processing and storage. The quantizer 410 may receive a non-quantized input signal 409 and transmit a quantized output signal 411.

The SDM 400 uses negative feedback across the quantizer 410 to shape the quantization noise, such that noise is attenuated in the band of interest at the expense of increased noise out of band. In audio applications, the band of interest is typically in the range 0-20 KHz.

The PWM 402 is an electronic device or circuit that generates pulse-width modulated signals. The PWN 112 may vary the width of pulses in a square wave, where the duty cycle, or the ratio of pulse duration to the total period, is adjusted.

The PWN 112 efficiently converts the signal 411 signal to discrete digital pulses, allowing precise control of voltage or current. The PWM 112 is a component in various applications, including switching power supplies, audio amplifiers, and digital-to-analog converters, providing a versatile method for signal modulation and control.

The PWM 402 may comprise a plurality of wave generators 414*a*, 414*b*, which in this example comprise a first wave generator 414*a* and a second wave generator 414*b*. The PWM 402 may comprise a plurality of operators, which in this example comprises a first operator 412*a* and a second operator 412*b*. The PWN 402 compares the quantized output signal 411 using operators 412*a*, 412*b*, and may also inverted and compare the quantized output signal 411, to a triangle-wave signal 418 to generate, using the wave generators 414*a*, 414*b*, two bi-level output signals 416*a*, 416*b*. The first bi-level output signal 414*a* may be referred to as the A-leg and the second bi-level output 414*b* may referred to as the B-leg.

FIG. 4*b* illustrates the PWM characteristic graph 430 between the outputs 416*a* and 416*b*, in this case for positive input signals for the digital modulator 306 in accordance with the third embodiment of the present disclosure.

The y-axis 206 of the PWM characteristic graph 430 represents the amplitude, such as a voltage level. The x-axis 208 of the characteristic graph 430 depicts a unit of time.

The PWM characteristic graph 430 comprises a constant-width duty cycle 434 (CWDC) and a variable-width duty cycle 436 (VWDC). The CWDC 434 has constant-width pulses when the signal 411 is at a low amplitude. When the amplitude of the signal 411 is greater than a predetermined transition point 432 then the duty transitions to a VWDC 436 wherein the pulses switch to variable-width pulses.

Figure 5:
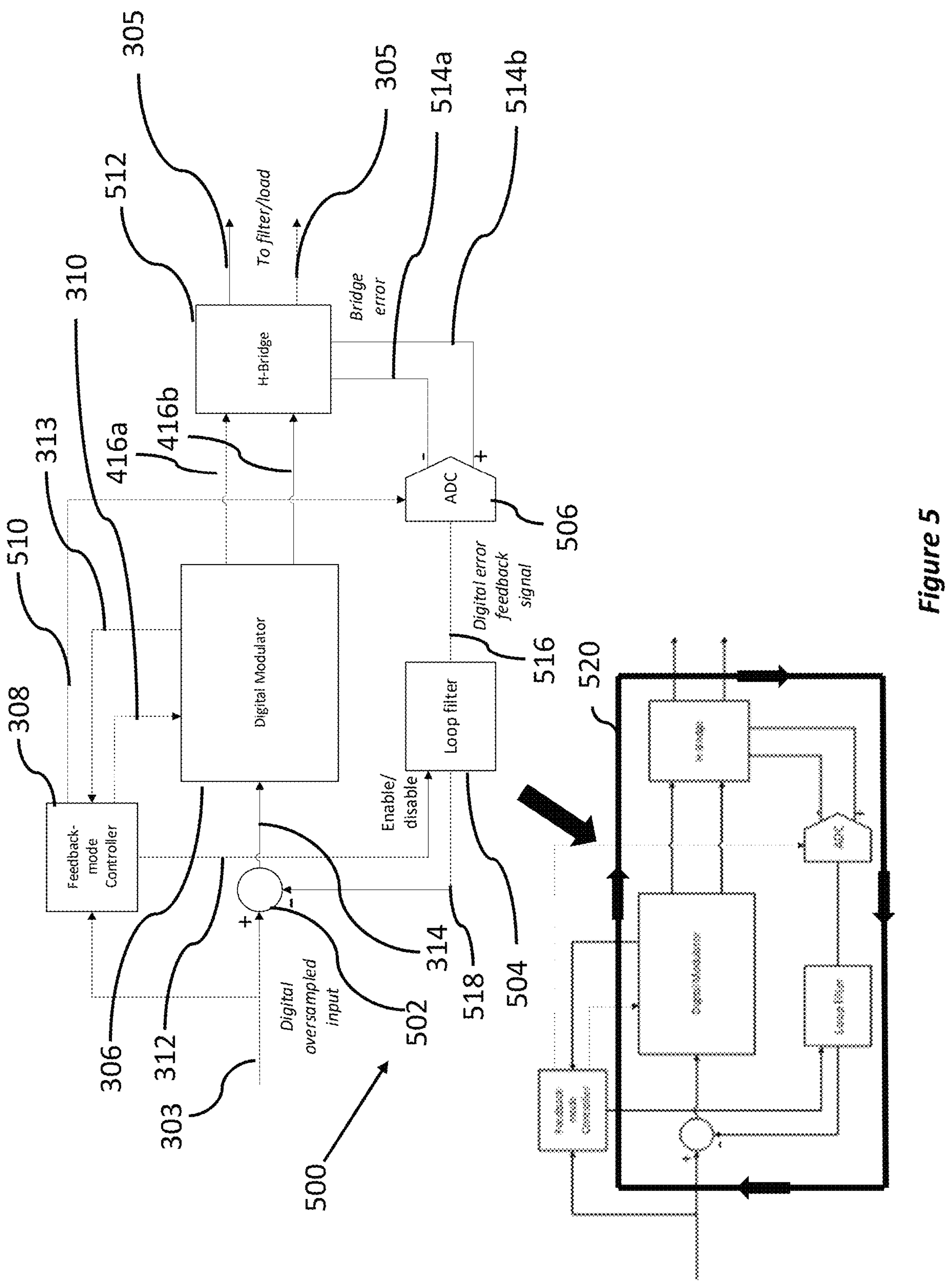
FIG. 5 is a schematic and modes of operation of a class D amplifier having an analog-to-digital converter in accordance with a fourth embodiment of the present disclosure.

FIG. 5 is a schematic of a class D amplifier 500 having an analog-to-digital converter 506 in accordance with a fourth embodiment of the present disclosure. FIG. 5 is a specific implementation of the class D amplifier 320 illustrated in FIG. 3*b*.

The Class D amplifier 500 may comprise, an adder 502, a closed loop filter 504, the ADC 506, the Controller 308, the digital modulator 306, and an h-bridge 512

The class D amplifier 500 is configurable to be operable in an open loop mode and a closed loop mode and wherein the class D amplifier can switch between the open loop mode and the closed loop mode. The class D amplifier 500 may be referred to as hybrid amplifier.

The class D amplifier 500 may receive a class D amplifier input signal 303 and transmit a class D amplifier output signal 305.

The class D amplifier 500 may comprise a closed feedback loop 520, wherein the class D amplifier 500 integrates feedback from the output 305 to the input 303. The closed feedback loop 500 may correct for inaccuracies in the output 305, enhancing performance. The adder 502, the digital modulator 306, the h-bridge, the ADC 506, and the loop filter 504 may be integral to the closed feedback loop 522.

The class D amplifier 500 may be operable open loop mode wherein the open loop mode operates without a feedback loop 520 from class D amplifier input 303 to the output 305. An open loop mode may not employ correction mechanisms based on the actual output 305.

The digital modulator 306 has been previously discussed. The digital modulator 306 may be integral to the closed feedback loop 304. The digital modulator 306 may be configured to receive a first modulator input 314 signal. The digital modulator 306 may be operable in an open loop mode and a closed loop mode. The digital modulator may transmit the pair of bi-level output signals—416*a*, 416*b*.

The controller 308 is configured to control the switching of the class D amplifier 320 between the open loop mode and closed-loop mode. For example, the controller 308 may decide when to transition from open-loop mode to closed-loop mode based on the input signal 303 characteristics, or the system parameters of the class D amplifier 500, or based on a DM observation signal 313 transmitted between the controller 308 and the digital modulator 306, or based on a ADC observation signal 510 between the controller 308 and the ADC 506. The controller 308 may transmit the control signal 312 to the loop filter 504 thereby enabling closed loop mode or disabling closed loop mode and transition to open loop mode.

The controller 308 may receive DM observation signals 313 that may be observations of properties of the digital modulator 306. The controller 308 may receive ADC observation signals 510 that may be observations of properties of the digital modulator 306. The detector may make observations of the digital modulator 306 and ADC 506 and transmit the observation signals 313, 510 to the controller 308.

The controller 308 makes the decision when to switch from open-loop to closed-loop mode and vice versa. The switch is done by enabling or disabling the closed-loop filter 504 to switch off the filter error signal 518.

The decision on when to switch mode by the controller 308 can be done in different ways. In this example the peak signal detector can detect a peak threshold from the input signal 303. When the signal level is above the threshold for a given amount of time, the controller outputs a signal to switch to closed-loop mode. When the signal 303 is below the threshold for a given amount of time, the controller outputs a control signal 312 to switch to open-loop mode. Time constants and hysteresis is used to make the decision robust. The threshold is chosen to ensure that when in open-loop mode, the pulses do not collide, or equivalently the noise-shaping quantizer is well within the single-quanta range.

The h-bridge 512 may share characteristics with the class D output stage 110 previously discussed. The h-bridge 512 converts the digital output of the modulator, in this example the pair of bi-level output signals—416*a*, 416*b*. The h-bridge 512 operates as a switching waveform suitable for driving a load, utilizing a low-pass demodulation filter (not shown). The h-bridge 512 may transmit class D amplifier output signal, or signals, 305. The h-bridge 512 may transmit a pair of bridge error signals 514*a*, 514*b* to the ADC 506 wherein the error is the difference between the input 416*a*, 416*b*, and the output 305.

The ADC 506 is an analog-to-digital converter and may share any characteristics of the known ADC 114 previously discussed. The ADC 506 is an electronic component or system that transforms continuous analog signals into discrete digital representations. The ADC 506 may receive the bridge error signals 514*a*, 514*b* and transmit a digital error signal 516 to the loop filter 504. The ADC 506 digitizes the error from the output stage, the h-bridge 512. In this embodiment, the ADC 506 is a sigma-delta ADC. The ADC 506 conversion from analog to digital may be provided via a stable voltage reference.

The loop filter 504 is a component to shape or filter the characteristics of the feedback signal to achieve specific performance goals of the class D amplifier 500. The loop filter 504 typically comprises components, such as adders, multipliers or delays. Its primary function is to shape the quantization noise and control the stability and bandwidth of the closed feedback loop 520. By adjusting the loop filter 504 parameters, desired trade-offs between speed, accuracy, and stability in the class D amplifier 500 can be altered.

The loop filter 504 may be enabled or disabled by receiving a control signal 312 from the controller 308. When the loop filter 504 is enabled the class D amplifier 500 may be in a closed loop mode. When the loop filter 504 is disabled the class D amplifier 500 may be in open loop mode.

The loop filter may transmit a loop filtered signal 518 to the adder 502. The adder 502 adds the loop filter signal 518 to the class D amplifier input signal 303 and transmits the combined digital modulator input signal 314 to the digital modulator 306.

Figure 6:
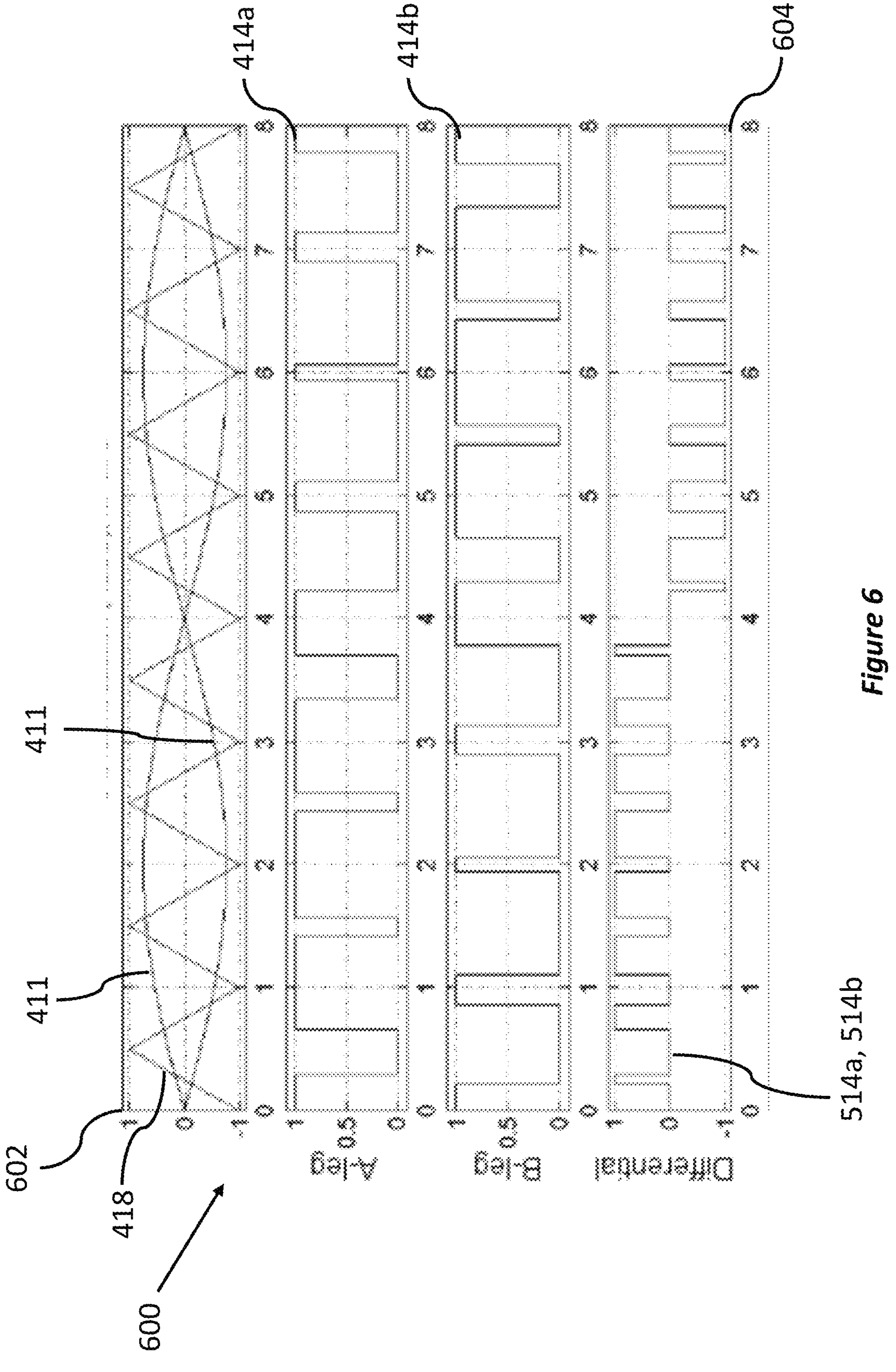
FIG. 6 is a graph of the characteristics of the pulse width modulator in accordance with a fifth embodiment of the present disclosure.

FIG. 6 illustrates a wave graph 600 of the characteristics of the digital modulator 306 bi-level outputs 416*a*, 416*b* in accordance with a fifth embodiment of the present disclosure.

The wave graph 600 comprises a y-axis 602 representing an amplitude an x-axis 604 representing a unit of time. The graph 600 displays the triangle reference wave 418 plotted against the quantised signal 411 noninverted and inverted.

The wave graph further displays A-leg signal 414*a*, the B-leg signal 414*b*, and the differential which is the differential Class D output signal 305. The differential 305 is the difference between the A-leg 414*a* and B-leg 414*b* and class D amplifier output 305.

Figure 7:
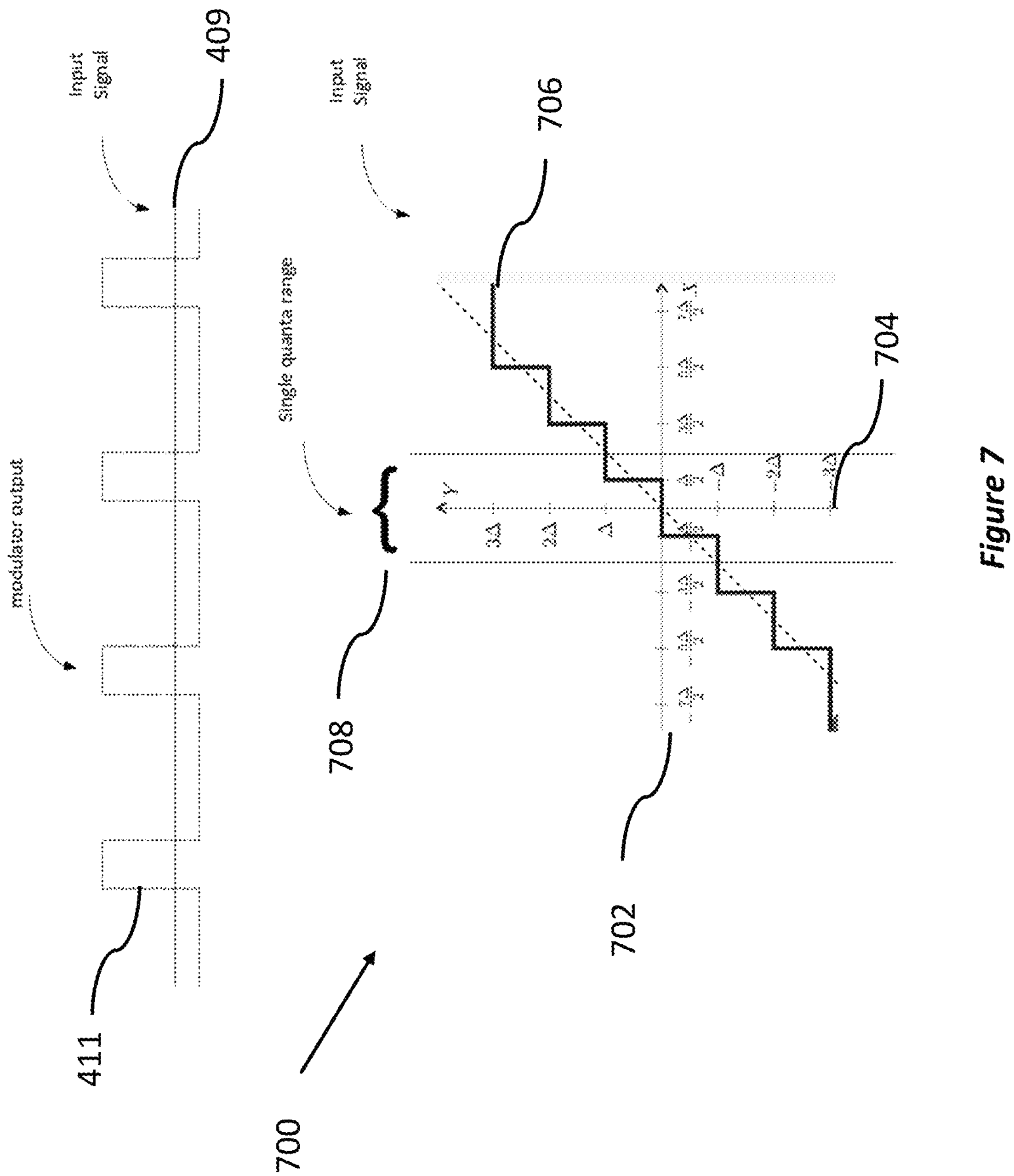
FIG. 7 is a graph of the characteristics of the quantizer in accordance with a sixth embodiment of the present disclosure.

FIG. 7 illustrates a mid-tread quantizer graph 700 of the characteristics of the quantizer 410 in accordance with a sixth embodiment of the present disclosure.

The mid-tread quantizer graph 700 depicts the characteristics of a quantization process using the quantizer 104, with delta units on both the x-axis 702 and y-axis 704.

The graph 700 depicts the quantization process discretizes the discrete input signal into a set of quantized levels, with the mid-point aligning with the zero level on the quantized output, the relationship between input 409 and output 411 in a mid-tread quantizer 410.

Delta units refer to the incremental changes or steps in the input signal 409. Each delta unit on the x-axis 702 and y-axis 704 corresponds to a specific change in the input signal 409 level.

The graph 700 depicts a single quanta range 708, wherein in this instance the range is +1 to −1 quanta. The quanta range refers to an incremental positive increase within the single-quanta range 708. Single-quanta 708 indicates a specific range of input amplitudes where the signal is small enough to fall within a single quantization level or quantum of the noise-shaper 400 which will produce an output 411 that has the same average level as the input 409, comprising only zeros, and single-width pulses describes the behaviour of a noise-shaper 400, particularly in response to a specific range of input signal 409.

Advantageously, for input signals 409 falling within the single-quanta range 708, the noise-shaper 400 behaves in a way that maintains the average level of the input 409, largely producing zero-level outputs 411, and generating single-width pulses thereby improving the digital modulator 306 precision and fidelity.

Figures 8A, 8B:
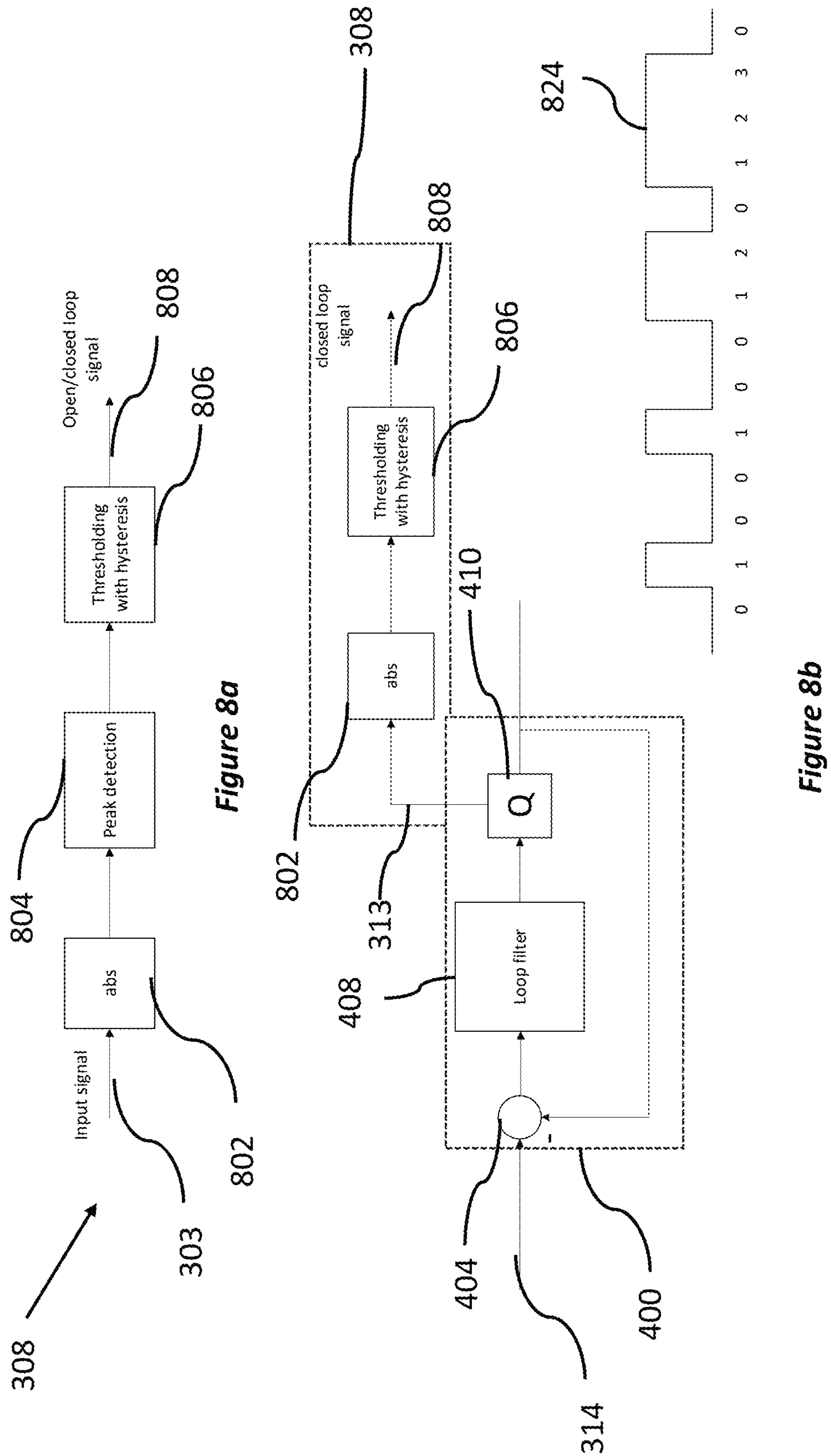
FIG. 8*a* is a specific implementation of the controller in accordance with a seventh embodiment of the present disclosure.
FIG. 8*b* illustrates specific embodiments of the controller and the sigma-delta modulator in accordance with an eighth embodiment of the present disclosure.

FIG. 8*a* is a specific implementation of the controller 308 as may be implemented in any of the embodiments described herein in accordance with the understanding of the skilled person, and in accordance with a seventh embodiment of the present disclosure.

The controller 308 comprises an abs component 802, a threshold peak detector 804 and a hysteresis module 806. In operation, the controller 308 receives the input signal 303 and then performs an abs operation using the abs component 802. In the context of detecting a signal for peak detection "abs" stands for the absolute value function.

The controller 308 then performs threshold peak detection using the threshold peak detector 804, taking the absolute value of the signal 303 followed by performing thresholding with hysteresis module 806. Thresholding with hysteresis, as provided by the hysteresis module 806, is a signal processing technique used with peak detection, as provided by the threshold peak detector 804, to improve robustness and prevent false triggers caused by noise or small fluctuations in the signal. Thresholding with hysteresis may involve setting two threshold levels: a higher threshold peak and a lower threshold peak.

When the signal 303 amplitude surpasses an upper threshold peak, it may trigger an action signal 808. The action signal 808 may trigger a transition of the Class D amplifier 320, 500 from closed loop mode to an open loop mode or transition from an open loop mode to a closed loop mode. In one example in use, in response to the signal 303 exceeding an upper threshold it triggers the action signal 808 to transition the class D amplifier 500 from open-loop to closed-loop. Conversely, when the signal 303 is lower than a lower threshold, it triggers the transition from closed-loop to open loop. To perform this action the controller 308 may transmit a control signal 312 enabling or disabling the loop filter 504. For example, the action signal 808 may be the control signal 312.

Lower threshold peak is detected using the upper threshold, the signal must fall below the lower threshold before another peak can be detected. The lower threshold is set at a lower amplitude than the upper threshold, providing hysteresis or a buffer zone.

Advantageously, the inclusion of hysteresis helps prevent false detections caused by noise or minor signal fluctuations. It introduces a "hysteresis band" between the upper and lower thresholds, requiring more substantial changes in the signal to initiate or terminate a detection event of a peak threshold of the input signal 303. This approach enhances the stability and reliability of the peak detection algorithm, making it less sensitive to small, transient variations in the signal.

The signal to switch from open to closed-loop mode can also be based on directly detecting when pulses collide. This can be done with a counter (not shown) that increases on every clock cycle when a (differential) pulse is produced and is reset when there is no pulse. The decision to switch to closed-loop occurs when the count value exceeds 1.

FIG. 8*b* illustrates specific embodiments of the controller 308 and the sigma-delta modulator 400 in accordance with an eighth embodiment of the present disclosure. The controller 308 is configured to provide a collision control process.

The collision control process may result in the transmission of the control signal 312 to the loop filter 504. The action signal 808 may be the control signal 312, as discussed previously.

The controller 308 receives a DM observation signal 313 from the quantizer 410. When the quantizer 410 produces an output of more than +/−one quanta. For example, this process can be performed done with a threshold comparator on the output of the quantizer 410.

The control signal 312 to switch from open- to closed-loop mode can also be determined by directly detecting when pulses collide. This can be done with a counter (not shown) that increases on every clock cycle when a differential pulse is produced and is reset when there is no pulse, as illustrated by a graph 824.

Figure 9:
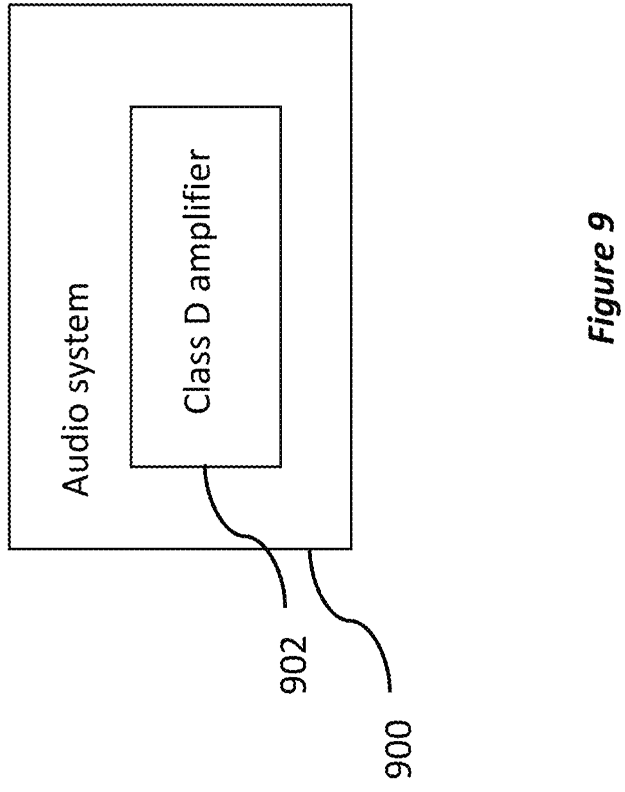
FIG. 9 is a schematic of an audio system comprising a class D amplifier in accordance with a ninth embodiment of the present disclosure.

FIG. 9 is a schematic of an audio system 900 comprising a class D amplifier 902 in accordance with a ninth embodiment of the present disclosure. The class D amplifier 902 may be implemented using any of the class D amplifiers as described herein, for example one the class D amplifiers 300, 320, 500. The audio system 900 may be headphones or speakers. The headphones may be wireless speakers.

Various improvements and modifications may be made to the above without departing from the scope of the disclosure.

The invention claimed is:

1. A class D amplifier for audio, wherein the class D amplifier is configured to:

be operable in an open loop mode;

be operable in a closed loop mode; and switch between the open loop mode and the closed loop mode, wherein the class D amplifier comprises:

a controller configured to control the switching of the class D amplifier between the open loop mode and closed loop mode; and a digital modulator configured to receive a modulator input signal, wherein:

the digital modulator is configured to operate as a pulse-density modulator arranged to provide a constant width pulse signal whilst the class D amplifier is operating in the open loop mode; and/or the digital modulator is configured to operate as a pulse-width modulator arranged to provide a varying pulse width signal whilst the class D amplifier is operating in the closed loop mode.

2. The class D amplifier of claim 1, wherein;

the controller is configured to provide a communication signal to the digital modulator, the communication signal comprising information on whether the class D amplifier is operating in the open loop mode or the closed loop mode; and the digital modulator is configured to operate as the pulse-density modulator or the pulse-width modulator depending on a mode of the class D amplifier as indicated by the communication signal.

3. The class D amplifier of claim 2, wherein the digital modulator comprises:

a noise shaper arranged to receive the modulator input signal and to quantize the modulator input signal from a first word length to a second word length, thereby providing a quantized noise shaper output.

4. The class D amplifier of claim 3, wherein the noise shaper comprises:

a sigma-delta modulator.

5. The class D amplifier of claim 4, wherein the first word length comprises 24 bits.

6. The class D amplifier of claim 5, wherein the second word length comprises 7 bits.

7. The class D amplifier of claim 6, wherein the digital modulator comprises:

a pulse modulator arranged to receive the quantized noise shaper output and invert the quantized noise shaper output then subsequentially splitting the inverted quantized noise shaper output, thereby providing the digital modulator a first bi-level output signal and a second bi-level output signal.

8. The class D amplifier of claim 7, wherein the controller comprises:

a detector that monitors a property of the class D amplifier; and wherein the controller determines a control of switching of the digital modulator between the open loop mode and closed loop mode based on the property monitored by the detector.

9. The class D amplifier of claim 8, further comprising:

a h-bridge switching element arranged to receive the first bi-level output signal and the second bi-level output signal and provide an error signal.

10. The class D amplifier of claim 9, further comprising:

an analog-to-digital converter arranged to receive an error signal from the h-bridge switching element and provide a digital error feedback signal.

11. The class D amplifier of claim 10, wherein the analog-to-digital converter comprises:

a sigma-delta analog-to-digital converter.

12. The class D amplifier of claim 11, further comprising:

a selectively enabling loop filter configured to receive the digital error feedback signal from the analog-to-digital converter and provide a loop signal to the digital modulator.

13. The class D amplifier of claim 12, wherein the controller is configured to transmit a control signal to the loop filter, thereby selectively enabling the loop filter and controlling the switching of the class D amplifier from the open loop mode to the closed loop mode or the switching of the class D amplifier from the closed loop mode to the open loop mode.

14. The class D amplifier of claim 12, wherein the property comprises:

a first threshold value of a class D amplifier input signal, and/or;

a pulse collision of the class D amplifier input signal; and a quanta differential determined, at least in part, from the modulator input signal and the quantized noise shaper output.

15. The class D amplifier of claim 14, wherein the controller sends a first control signal to the loop filter in response to the detector detecting a first the property of the modulator input signal, wherein the first control signal disables transmission of the modulator input signal, thereby transitioning the digital modulator from the open loop mode to the closed loop mode.

16. The class D amplifier of claim 15, wherein the response to the detector detecting the property of the modulator input signal occurs over a predetermined period.

17. The class D amplifier of claim 16, wherein the controller comprises:

a clock to record a timer of operation in the closed loop mode and wherein:

the controller sends a second control signal to the digital modulator to switch the digital modulator from the closed loop mode to the open loop mode in response to the timer recording a predetermined closing time.

18. An audio system comprising a class D amplifier, wherein the class D amplifier is configured to:

be operable in an open loop mode;

be operable in a closed loop mode; and switch between the open loop mode and the closed loop mode, wherein the class D amplifier comprises:

a controller configured to control the switching of the class D amplifier between the open loop mode and closed loop mode; and a digital modulator configured to receive a modulator input signal, wherein:

the digital modulator is configured to operate as a pulse-density modulator arranged to provide a constant width pulse signal whilst the class D amplifier is operating in the open loop mode; and/or the digital modulator is configured to operate as a pulse-width modulator arranged to provide a varying pulse width signal whilst the class D amplifier is operating in the closed loop mode.

19. The audio system of claim 18, comprising a headphones or a speaker.

20. A method of controlling a class D amplifier being operable in an open loop mode and a closed loop mode, the method comprising:

switching from the closed loop mode to the open loop mode; and/or switching from the open loop mode to the closed loop mode, wherein the class D amplifier comprises:

a controller configured to control the switching of the class D amplifier between the open loop mode and closed loop mode; and a digital modulator configured to receive a modulator input signal, wherein:

the digital modulator is configured to operate as a pulse-density modulator arranged to provide a constant width pulse signal whilst the class D amplifier is operating in the open loop mode; and/or the digital modulator is configured to operate as a pulse-width modulator arranged to provide a varying pulse width signal whilst the class D amplifier is operating in the closed loop mode.

* * * * *